(12) United States Patent
Kumada et al.

(10) Patent No.: US 10,474,285 B2
(45) Date of Patent: Nov. 12, 2019

(54) CONTROLLER, INPUT DEVICE, INPUT SYSTEM, DISPLAY APPARATUS, AND CONTROL METHOD

(71) Applicant: FUJITSU TEN LIMITED, Kobe-shi, Hyogo (JP)

(72) Inventors: Takahiro Kumada, Kobe (JP); Minoru Hirashima, Kobe (JP); Tatsuya Yamaguchi, Kobe (JP); Yoshihiro Nakao, Kobe (JP)

(73) Assignee: FUJITSU TEN LIMITED, Kobe (JP)

( * ) Notice: Subject to any disclaimer, the term of this patent is extended or adjusted under 35 U.S.C. 154(b) by 112 days.

(21) Appl. No.: 15/654,825

(22) Filed: Jul. 20, 2017

(65) Prior Publication Data
US 2018/0059857 A1    Mar. 1, 2018

(30) Foreign Application Priority Data
Sep. 1, 2016 (JP) ................... 2016-170971

(51) Int. Cl.
*G06F 3/041* (2006.01)
*G06F 3/01* (2006.01)
(Continued)

(52) U.S. Cl.
CPC ............ *G06F 3/0416* (2013.01); *G06F 3/016* (2013.01); *G06F 3/0234* (2013.01);
(Continued)

(58) Field of Classification Search
CPC ................................. G06F 3/016; G06F 3/041
See application file for complete search history.

(56) References Cited

U.S. PATENT DOCUMENTS

2010/0114974 A1* 5/2010 Jung ............... G06F 3/016
  707/802
2012/0154317 A1* 6/2012 Aono ............... G06F 3/016
  345/173
(Continued)

FOREIGN PATENT DOCUMENTS

JP    2013-109429 A    6/2013
JP    2016-001510 A    1/2016
JP    2016-057764 A    4/2016

*Primary Examiner* — Roy P Rabindranath
(74) *Attorney, Agent, or Firm* — Oliff PLC

(57) ABSTRACT

A controller includes a position detecting unit, switching unit, vibration controlling unit, and vibration detecting unit. The position detecting unit detecting a contact position with an operation surface. The switching unit switches between vibration and detection modes of at least one vibration element in accordance with temporal change in contact position detected by position detecting unit, the vibration mode being a mode wherein at least one vibration element vibrates, and detection mode being a mode wherein at least one vibration element detects vibration. The vibration controlling unit causes one or more first vibration elements to vibrate so as to vibrate the operation surface, at least one vibration element including one or more first vibration elements. The vibration detecting unit detects an operation surface's vibration based on vibration's detection results detected by one or more second vibration elements, at least one vibration element including the one or more second vibration elements.

14 Claims, 10 Drawing Sheets

(51) Int. Cl.
*G06F 3/023* (2006.01)
*G06F 3/0354* (2013.01)
*G06F 3/044* (2006.01)
*H03K 17/96* (2006.01)

(52) U.S. Cl.
CPC .......... *G06F 3/03547* (2013.01); *G06F 3/044* (2013.01); *G06F 3/0412* (2013.01); *G06F 3/0414* (2013.01); *H03K 17/964* (2013.01); *B60K 2370/1438* (2019.05); *B60K 2370/52* (2019.05); *H03K 2217/96062* (2013.01)

(56) References Cited

U.S. PATENT DOCUMENTS

| | | | |
|---|---|---|---|
| 2012/0162114 A1* | 6/2012 | Inoue | G06F 3/016 345/173 |
| 2014/0320440 A1* | 10/2014 | Satake | G06F 3/0488 345/173 |
| 2015/0042461 A1 | 2/2015 | Shinozaki et al. | |
| 2016/0034057 A1* | 2/2016 | Ikeda | H04M 1/03 345/173 |

\* cited by examiner

CONTROLLER, INPUT DEVICE, INPUT SYSTEM, DISPLAY APPARATUS, AND CONTROL METHOD

CROSS-REFERENCE TO RELATED APPLICATION

This application is based upon and claims the benefit of priority of the prior Japanese Patent Application No. 2016-170971, filed on Sep. 1, 2016, the entire contents of which are incorporated herein by reference.

FIELD

The embodiment discussed herein is directed to a controller, an input device, an input system, a display apparatus, and a control method.

BACKGROUND

Conventionally, there is known an input device such as a touch sensor that gives a tactile sense to a user so as cause the user to recognize an acceptance of the input operation. This input device controls a "vibration element that gives a vibration to the user" in response to a "detection result of a vibration element that detects the vibration to an operation surface" so as to give, to the user, feedback on a predetermined operation feeling (see Japanese Laid-open Patent Publication No. 2013-109429, for example).

However, there exists a problem that the conventional input device needs a "vibration element that detects a vibration of an operation surface" and "vibration element that vibrates the operation surface," and thus the input device becomes large.

SUMMARY

A controller according to an aspect of the embodiment includes a position detecting unit, a switching unit, a vibration controlling unit and a vibration detecting unit. The position detecting unit that detects a contact position with an operation surface. The switching unit switches between vibration and detection modes of at least one vibration element in accordance with a temporal change in the contact position detected by the position detecting unit, the vibration mode being a mode in which the at least one vibration element is caused to vibrate, and the detection mode being a mode in which the at least one vibration element detects a vibration. The vibration controlling unit causes, in the vibration mode, one or more first vibration elements to vibrate so as to vibrate the operation surface, the at least one vibration element including the one or more first vibration elements. The vibration detecting unit detects, in the detection mode, a vibration of the operation surface based on detection results of the vibration detected by one or more second vibration elements, the at least one vibration element including the one or more second vibration elements.

BRIEF DESCRIPTION OF DRAWINGS

A more complete appreciation of the disclosed technology and many of the attendant advantages thereof will be readily obtained as the same becomes better understood by reference to the following detailed description when considered in connection with the accompanying drawings, wherein.

DESCRIPTION OF EMBODIMENT

Hereinafter, a controller, an input device, an input system, a display apparatus, and a control method disclosed in the present application will be described in detail with reference to the accompanying drawings. Moreover, the embodiment described below is merely one example, and not intended to limit the present disclosure.

Figure 1A:
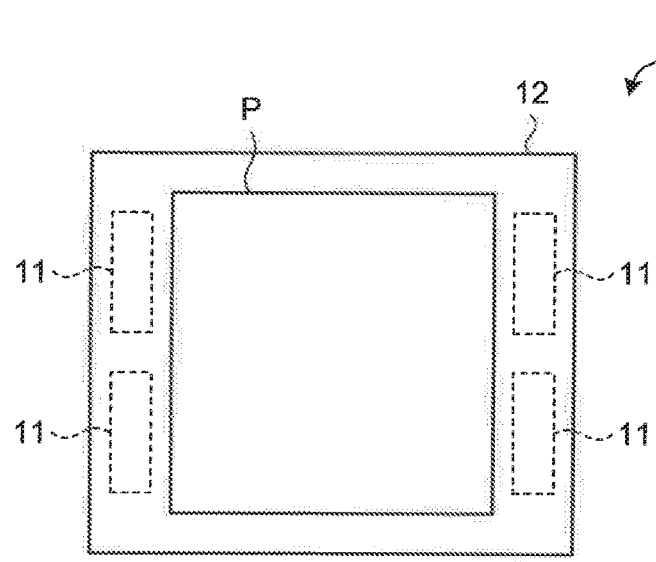
FIGS. 1A and 1B are diagrams illustrating the outline of an input system according to an embodiment.
Figure 1B:
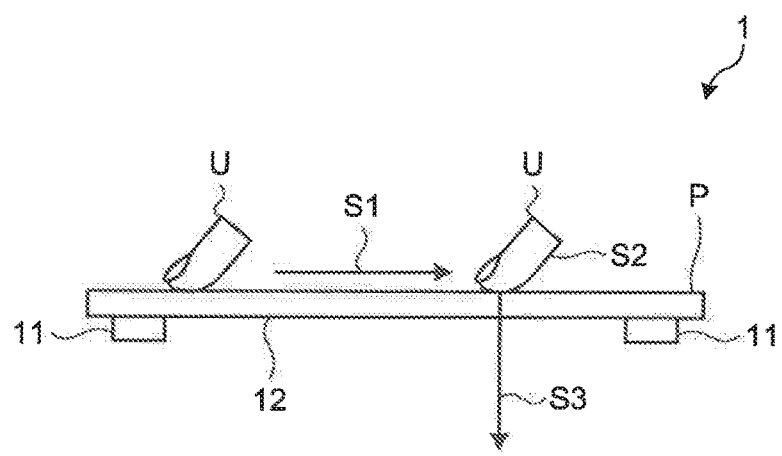

First, the outline of an input system 1 according to the present embodiment will be explained with reference to FIGS. 1A and 1B. FIGS. 1A and 1B are diagrams illustrating the outline of the input system 1 according to the embodiment of the present disclosure.

As illustrated in FIG. 1A, the input system 1 includes: (i) an input device including a plurality of vibration elements 11 and an operation unit 12 and; (ii) a controller (not illustrated) that controls the input device. This input system 1 is, for example, a touch pad having a vibration function that vibrates an operation surface P of the operation unit 12. This input system 1 is also a touch pad having a depression-pressure detecting function that detects a pressing force from a user U. As described below, this input system 1 may be combined with a display such as a liquid-crystal display and may be used as a touch panel having vibration and depression-pressure detecting functions.

The operation unit 12 is a plate-shaped member having an information inputting function of, for example, an electrostatic capacity type. This operation unit 12 includes the operation surface P so as to detect a contact position of the user U with the operation surface P. The contact of the user U with the operation surface P is performed by, for example, a contact of a finger and the like of the user U with the operation surface P or a contact of a stylus and the like with the operation surface P.

The plurality of vibration elements 11 includes, for example, piezoelectric elements. The plurality of vibration elements 11 are arranged, for example, on the periphery of the operation surface P. As illustrated in FIG. 1B, the plurality of vibration elements 11 is fixed, by using the adhesive and the like, to a surface opposed to a surface of the operation Unit 12, which is to be in contact with the user U, in other words, a back surface of the operation surface P.

The plurality of vibration elements 11 is controlled by a controller, and vibrates, in such a state that a finger of the user U is in contact with the operation surface P, so as to give a vibration to the finger of the user U. The plurality of vibration elements 11 detects a vibration that is generated in response to a depression of the operation surface P performed by a finger of the user U. The controller detects a pressing force of the depression of the operation surface P on the basis of the vibration detected by the plurality of vibration elements 11. Thus, the plurality of vibration elements 11 combines two functions of a "vibration function for vibrating the operation surface P" and a "detection function for detecting a vibration of the operation surface P."

The controller controls the plurality of vibration elements 11 so that the plurality of vibration elements 11 is switched between the vibration function (vibration mode) and the detection function (detection mode) in accordance with a change in a contact position of the user U detected by the operation unit 12 so as to operate. Specifically, caused by a control of the controller, the plurality of vibration elements 11 vibrates the operation surface P or detects a pressing force as a vibration of the operation surface P, in accordance with whether or not a contact position is moving. Hereinafter, with reference to FIG. 1B, operations of the plurality of vibration elements 11 will be explained.

As illustrated in FIG. 1B, when a contact position of the user U is moving (Step S1), the plurality of vibration elements 11 vibrates the operation surface P so as to give a predetermined tactile sense to the user U.

For example, the plurality of vibration elements 11 vibrates the operation surface P in an ultrasonic frequency band. Thus, a state of an air layer between a finger of the user U and the operation surface P changes, so that the frictional force between the finger of the user U and the operation surface P reduces.

When the user U moves a finger in such a state that the plurality of vibration elements 11 vibrates the operation surface P in an ultrasonic frequency band, because the frictional force between the finger of the user U and the operation surface P is low, for example, a smooth feeling can be given to the finger of the user U.

Next, when the contact position of the user U stops (Step S2), the plurality of vibration elements 11 stops the vibration so as to operate as detection sensors that detect a vibration. The plurality of vibration elements 11 detects a pressing force, which is generated by a depression of the operation surface P performed by a finger of the user U, as a vibration of the operation surface P (Step S3).

Thus, the plurality of vibration elements 11 combines the vibration function for vibrating the operation surface P and the detection function for detecting a pressing force applied to the operation surface P, and the controller switches between the vibration and detection functions of the plurality of vibration elements 11 in accordance with a change in a contact position of the user U. Thus, the input device is not needed to include an element for vibrating the operation surface P and a detection sensor for detecting a pressing force, and thus enlargement of the input device can be suppressed. Moreover, the number of the vibration element 11 can be reduced to be able to reduce manufacturing cost.

Figure 2:
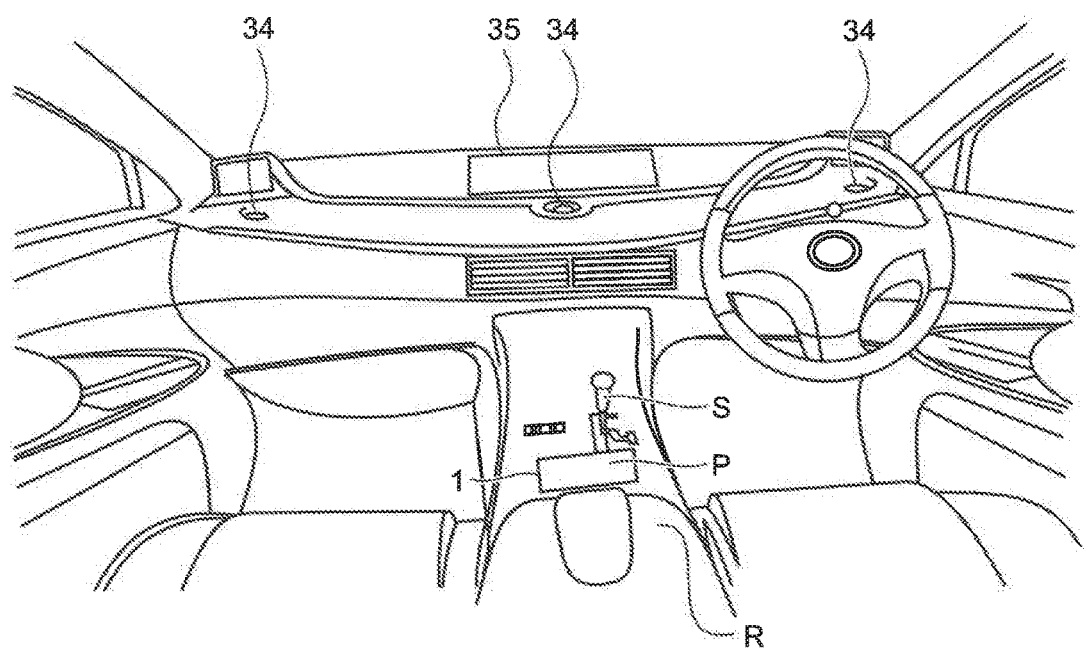
FIG. 2 is a diagram illustrating a mounted example of the input system according to the embodiment.

Next, a mounted example of the input system 1 according to the present embodiment will be explained reference to FIG. 2. FIG. 2 is a diagram illustrating the mounted example of the input system 1 according to the embodiment of the present disclosure.

As illustrated in FIG. 2, the input system 1 according to the present embodiment is provided in, for example, a vehicle. The input system 1 is connected with, for example, an on-vehicle apparatus 30 to be mentioned later through a network so as to function as an input device of this on-vehicle apparatus 30. The input device of the input system 1 includes an operation accepting part (for example, operation surface P illustrated in FIG. 1A) such as a touch pad, which accepts an input operation of the user U.

The operation surface P is arranged in a position where a driver can easily operates the operation surface P, such as a neighborhood of a shift lever S of a center console. In the example illustrated in FIG. 2, the operation surface P is arranged between an armrest R and the shift lever S. Thus, the user U can operate the operation surface P with his/her arm putting on the armrest R. Thus, the user U can easily operate the input system 1 without changing his/her driving posture.

The on-vehicle apparatus 30 (see FIG. 3) includes various devices such as an audio device, an air conditioner, and a car navigation system. Thus, the user U operates the input system 1 to be able to operate these various devices. The on-vehicle apparatus 30 includes a "speaker 34 that outputs a predetermined sound" and a "display 35 that displays a predetermined image."

When detecting a contact of the user U, the above input system 1 gives a vibration to the user U in accordance with a change in a contact position, or detects a pressing force of depression of the operation surface P performed by the user U. Hereinafter, details of the input system 1 according to the present embodiment will be explained with reference to FIG. 3.

Figure 3:
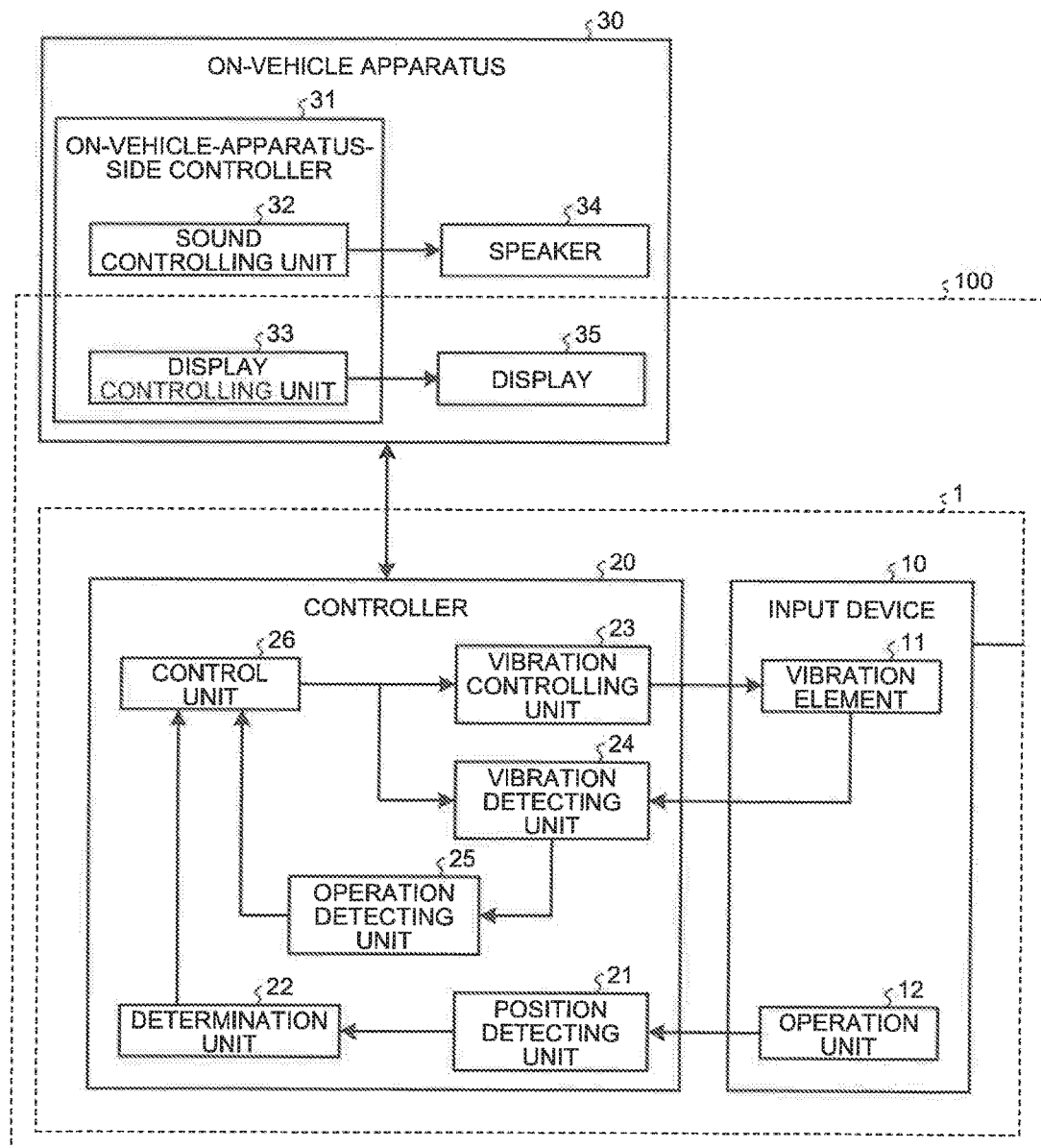
FIG. 3 is a block diagram illustrating a configuration of the input system according to the embodiment.

FIG. 3 is a block diagram illustrating a configuration of the input system 1 according to the present embodiment. Configuration elements needed for explaining features of the present embodiment are illustrated by using functional blocks, and illustration of common configuration elements omitted.

In other words, the configuration elements illustrated in FIG. 3 are functionally conceptual, and thus they are not to be physically configured as illustrated in the drawings. For example, specific forms of distribution and integration of the configuration elements are not limited to those illustrated in the drawings, and all or some of the devices can be configured by separating or integrating the apparatus functionally or physically in any unit, according to various types of loads, the status of use, etc.

As illustrated in FIG. 3, the input system 1 includes an input device 10 and a controller 20, and is connected with the on-vehicle apparatus 30 through a network.

The input device 10 accepts an operation from the user U. The input device 10 includes the at least one vibration element 11 and the operation unit 12.

As described above, the at least one vibration element 11 includes a piezoelectric actuator such as a piezoelectric element. The at least one vibration element 11 expands and contracts caused by an Alternating-Current voltage (AC voltage) supplied from the controller 20 so as to vibrate the operation unit 12. The at least one vibration element 11 is expanded and contracted by a vibration of the operation unit 12 so as to generate a voltage signal, and outputs the voltage signal to the controller 20.

Figure 4:
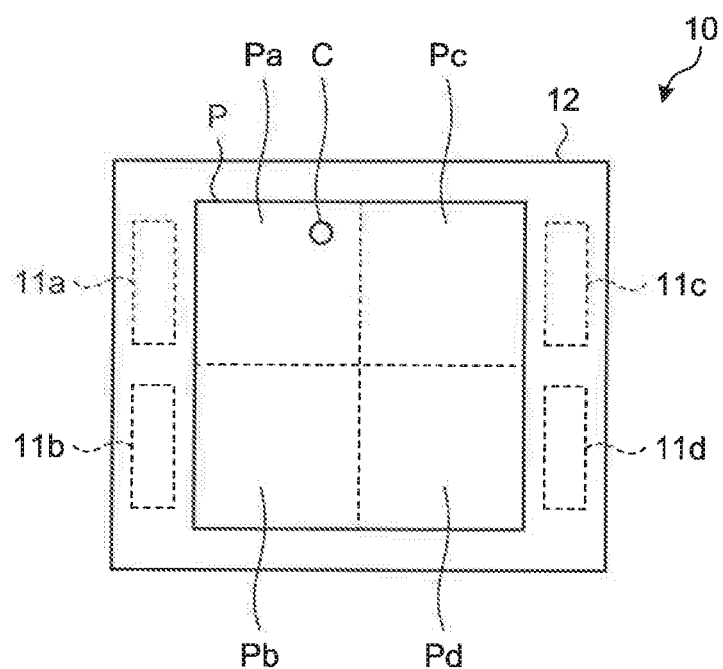
FIG. 4 is a diagram illustrating an arrangement example of vibration elements according to the embodiment.

In the example illustrated in FIG. 4, the input device 10 includes four vibration elements 11a to 11d. The four vibration elements 11a to 11d are arranged on the periphery of the operation surface P of the operation unit 12. In FIG. 4, the vibration elements 11a and 11b are arranged in a neighborhood of one short side of the operation surface P, and the vibration elements 11c and 11d are arranged in a neighborhood of a short side opposed to the one short side. Thus, each two of the vibration elements 11a to 11d are arranged in, for example, the neighborhoods of the corresponding short side of the rectangular-shaped operation surface P. Thus, the vibration elements 11a to 11d can efficiently vibrate the operation surface P.

FIG. 4 is a diagram illustrating an arrangement example of the vibration elements 11a to 11d. The arrangement of the vibration elements 11a to 11d illustrated in FIG. 4 is one example, and is not limited thereto. For example, the vibration elements 11 may be arranged in neighborhoods of respective sides of the operation surface P. Moreover, the number of the vibration elements 11a to 11d is not limited to "four." For example, as illustrated in FIG. 3, the number of the vibration elements 11 may be "one." Thus, the vibration element 11 may be more or less than four.

The vibration elements 11 operate in any of three operation modes on the basis of an instruction from the controller 20. Specifically, when a contact position C of the user U moves, the vibration elements 11 operate in a first vibration mode so as to vibrate at a frequency in an ultrasonic frequency band, when the user U is at a stop, the vibration elements 11 operate in a vibration detecting mode. When the controller 20 detects a depression operation or an end of a depression operation of the user U, the vibration elements 11 operate in a second vibration mode in which the vibration elements 11 vibrate at a lower frequency than that of the first vibration mode. The operation modes will be mentioned later with reference to FIGS. 5 to 9.

Returning to FIG. 3, as described above, the operation unit 12 is a plate-shaped member having an information inputting function of, for example, an electrostatic capacity type. It is sufficient that the operation unit 12 has the operation surface P that can detect a contact of the user U, not limited to the electrostatic capacity type, for example, an operation unit that detect a contact of the user U may employ an infrared type or a resistance film type.

The operation unit 12 includes the operation surface P that accepts an input operation of the user U (see FIG. 4). The operation unit 12 detects, with a predetermined period, the contact position C between the user U and the operation surface P, and outputs information (e.g., coordinate information) according to the contact position C of the user U to the controller 20.

The controller 20 switches between the operation modes of the vibration element 11 in accordance with a change in the contact position C detected by the operation unit 12 of the input device 10. The controller 20 is a microcomputer including a Central Processing Unit (CPU) and a memory, and controls a whole of the input system 1. The controller 20 is mounted on, for example, an Electric Control Unit (ECU). The controller 20 includes, as functions to be realized in a software manner by the microcomputer, a position detecting unit 21, a determination unit 22, a vibration controlling unit 23, a vibration detecting unit 24, an operation detecting unit 25, and a control unit 26.

The position detecting unit 21 acquires, with a predetermined period, a detection result of the operation unit 12 so as to detect the contact position C of the user U on the operation surface P. The position detecting unit 21 outputs the detected contact position C to the determination unit 22.

The determination unit 22 determines whether the contact position C is moving or is at a stop in accordance with a temporal change in the contact position C detected by the position detecting unit 21. For example, when a contact position C1 detected at a present time by the position detecting unit 21 is the same as a contact position C0 detected at a last time, the determination unit 22 determines that the contact position C1 is at a stop. For example, when the contact position C1 detected at a present time is different form the contact position C0 detected at a last time, the determination unit 22 determines that the contact position C1 is moving. The determination unit 22 outputs a determination result to the control unit 26.

Herein, when the contact position C0 detected at a last time is the same as the contact position C1 detected at a present time, in other words, when a moving speed of the contact position C is zero, the determination unit 22 is determined to be at a stop, however, is not limited thereto. The determination unit 22 may be determined to be at a stop, for example, when a distance between the contact position C0 detected at a last time and the contact position C1 detected at a present time is less than a predetermined threshold, in other words, when a moving speed of the contact C is less than a predetermined threshold. Alternatively, the determination unit 22 may determine the move/stop in accordance with a distance between the contact position C1 detected at a present time and the contact position C detected before a last time.

The vibration controlling unit 23 performs a control so that an AC voltage is applied to the vibration element 11 on the basis of an instruction of the control unit 26 and thus the vibration element 11 vibrates at a desired frequency. Specifically, the vibration controlling unit 23 controls the vibration element 11 so that the vibration element 11 operates in the first vibration mode when the contact position C of the user U is moving. The vibration controlling unit 23 controls the vibration element 11 so that the vibration element 11 operates in the second vibration mode when the user U depresses the input device 10. For example, as illustrated in FIG. 4, when the input device 10 includes the plurality of vibration elements 11a to 11d, the vibration controlling unit 23 performs a control so as to cause all of the vibration elements 11a to 11d to vibrate.

Figure 5:
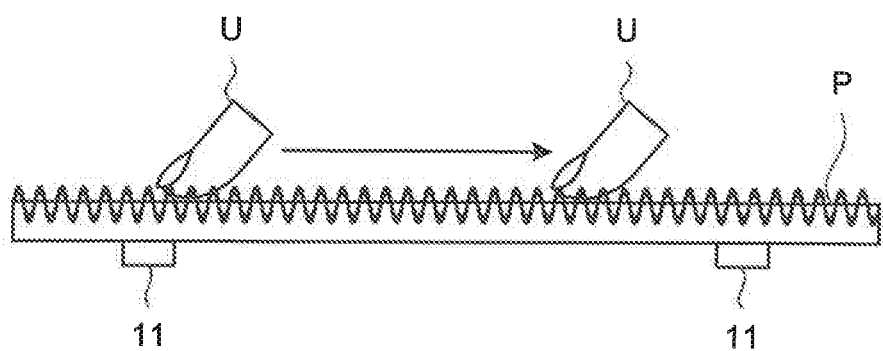
FIG. 5 is a diagram explaining a first vibration mode according to the embodiment.
Figure 6:
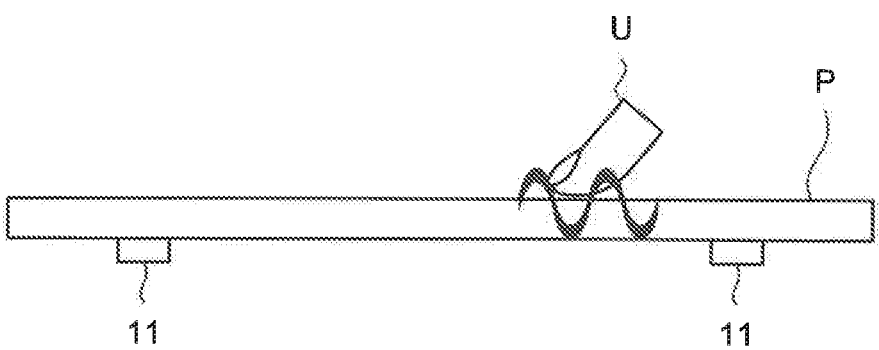
FIG. 6 is a diagram explaining a second vibration mode according to the embodiment.

The first and second vibration modes will be explained with reference to FIGS. 5 and 6. FIG. 5 is a diagram explaining the first vibration mode. FIG. 6 is a diagram explaining the second vibration mode.

As illustrated in FIG. 5, the first vibration mode is an operation mode in which the operation surface P is vibrated at a frequency f1 in an ultrasonic frequency band. For example, when the contact position C of the user U moves, the control unit 26 sets the first vibration mode. In this case, the vibration controlling unit 23 controls the vibration elements 11 so that the vibration elements 11 vibrate at the frequency f1 in an ultrasonic frequency band. Thus, the vibration controlling unit 23 can give a smooth tactile sense to the user U.

As illustrated in FIG. 6, the second vibration mode is an operation mode in which the operation surface P is vibrated at a frequency f2 that is lower than the frequency f1 of the first vibration mode. For example, when the user U depresses the operation surface P, the control unit 26 sets the second vibration mode. In this case, the vibration controlling unit 23 controls the vibration elements 11 so that the vibration elements 11 vibrate at the frequency f2.

Thus, when accepting a depression operation, the vibration controlling unit 23 can give a click feeling, such as a snap feeling, to the user U, so that it is possible to inform the user U of an acceptance of the depression operation.

Timings at which the control unit 26 sets the first and second vibration modes will be mentioned later with reference to FIG. 10.

The vibration detecting unit 24 acquires voltage signals generated by the vibration elements 11 so as to detect a vibration of the operation surface P. The vibration detecting unit 24 outputs the vibration detected in the vibration detecting mode to the operation detecting unit 25. In other words, the vibration elements that are caused to detect a vibration by the vibration detecting unit 24 are the same as the vibration elements that are caused to vibrate by the vibration controlling unit 23.

Thus, it is sufficient that no vibration element for detecting a vibration of the operation surface P is provided in addition to the vibration elements for vibrating the operation surface P, and thus enlargement of the input device can be suppressed.

The vibration detecting unit 24 detects, as a vibration of the operation surface P, a voltage signal generated by at least one of the vibration elements 11 in accordance with, for example, the contact position C detected by the position detecting unit 21. For example, the vibration detecting unit 24 detects, as a vibration of the operation surface P, a voltage signal generated by the vibration element 11 closest to the contact position C. This point will be specifically explained with reference to FIG. 4.

As illustrated in FIG. 4, it is assumed that the input device 10 includes the four vibration elements 11a to 11d. As illustrated in FIG. 4 it is assumed that the operation surface P includes four regions Pa to Pd. For example, when the user U depresses the operation surface P at the contact position C in the region Pa, the vibration elements 11a to 11d generate respective voltage signals according to a pressing force generated by this depression so as to output the voltage signals to the vibration detecting unit 24.

The vibration detecting unit 24 detects from among the four voltage signals accepted from the vibration elements 11a to 11d, as a vibration of the operation surface P, the voltage signal generated by the vibration element 11a closest to the contact position C. In other words, the vibration detecting unit 24 previously associates the regions Pa to Pd with the respective vibration elements 11a to 11d, when detecting the contact position C in any one of the regions Pa to Pd, the vibration detecting unit 24 detects a voltage signal generated by the corresponding one of the vibration elements 11a to 11d.

Thus, the vibration detecting unit 24 detects, as a vibration of the operation surface P, a voltage signal generated by the vibration element 11 closest to the contact position C to be able to detect the vibration of the operation surface P more reliably.

Herein, the vibration detecting unit 24 is configured to detect a voltage signal of the vibration element 11 closest to the contact position C, not limited thereto. For example, the vibration detecting unit 24 may detect, as a vibration of the operation surface P, the largest voltage signal of voltage signals generated by the plurality of vibration elements 11a to 11d. Alternatively, the vibration detecting unit 24 may detect, as a vibration of the operation surface P, a signal obtained by averaging voltage signals generated by the plurality of vibration elements 11a to 11d.

For example, when the vibration elements 11 always output voltage signals to the vibration detecting unit 24 in any operation mode, the vibration detecting unit 24 is configured to output, to the operation detecting unit 25, the voltage signal acquired during the vibration detecting mode, and is configured not to output, to the operation detecting unit 25, the voltage signal acquired during the first and second vibration modes.

This is because the vibration elements 11 vibrate on the basis of a control performed by the vibration controlling unit 23 during the first and second vibration modes, and thus any of the vibration elements 11 detects no vibration generated by a depression of the operation surface P performed by the user U. Thus, when the vibration elements 11 detect a vibration generated by a depression of the operation surface P performed by the user U, the vibration detecting unit 24 can output a detection result to the operation detecting unit 25.

For example, when the vibration elements 11 output voltage signals only during the vibration detecting mode, the vibration detecting unit 24 outputs, to the operation detecting unit 25, the voltage signal acquired from the vibration element 11.

Figure 7A:
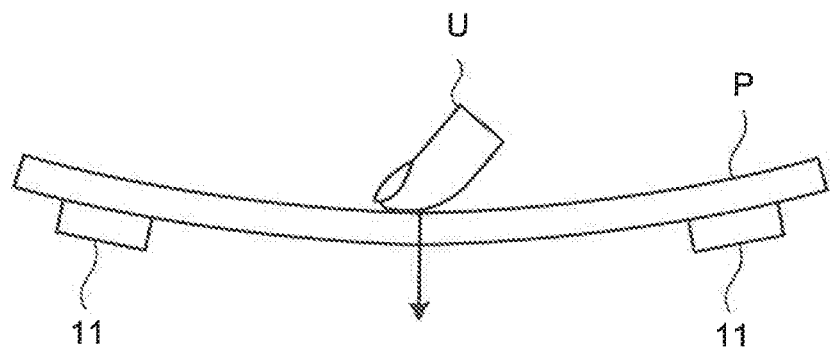
FIGS. 7A and 7B are diagrams illustrating a vibration of an operation surface according to the embodiment.
Figure 7B:
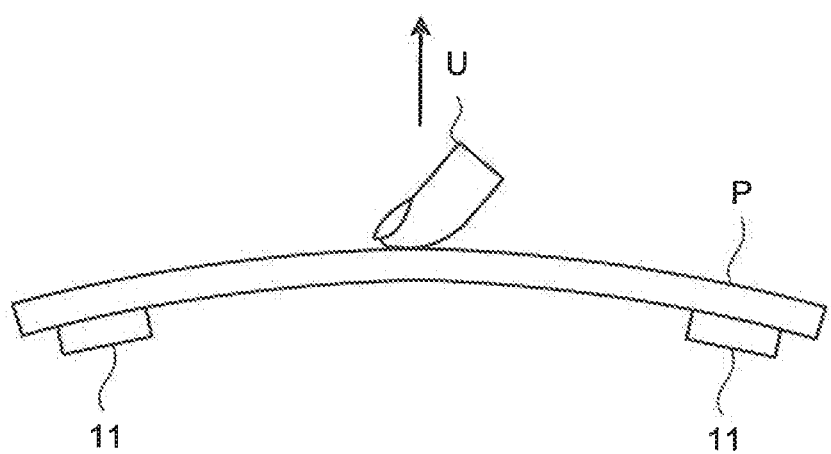
Figure 8:
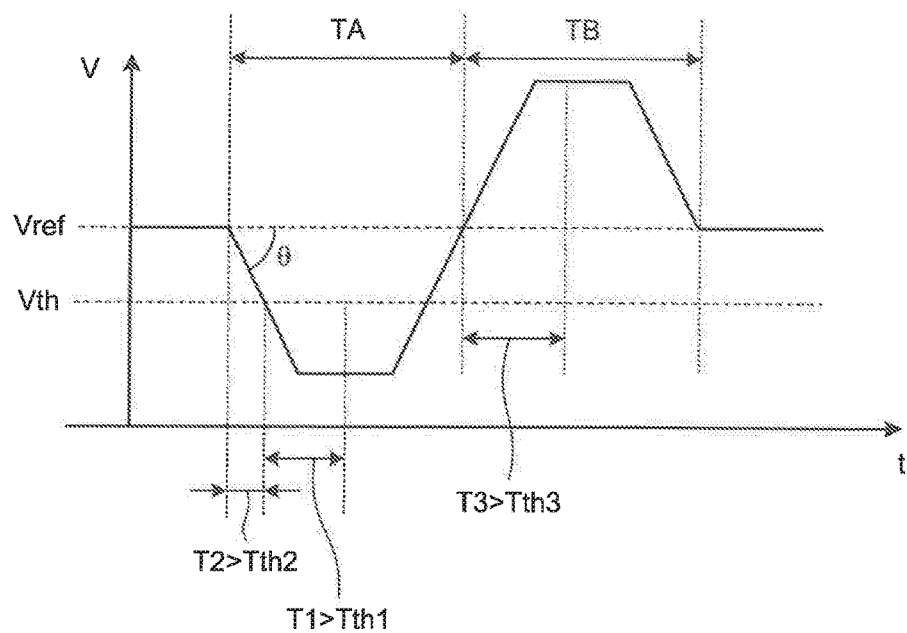
FIGS. 8 and 9 are diagrams illustrating examples of voltage signals detected by a vibration detecting unit according to the embodiment.

Next, with reference to FIGS. 7A to 8, a vibration of the operation surface P, which is to be detected by the vibration detecting unit 24 when the user U depresses the operation surface P, will be explained. FIGS. 7A and 7B are diagrams illustrating a vibration of the operation surface P. FIG. 8 is a diagram illustrating one example of a voltage signal detected by the vibration detecting unit 24.

For example, when the user U depresses the operation surface P, as illustrated in FIG. 7A, a pressing force is applied to the operation surface P in a depressing direction (in FIG. 7A, downward direction), and thus the operation surface P is deflected. In FIG. 7A, for convenience of explanation, a deflected amount of the operation surface P is illustrated with emphasis, however in actual fact, the deflection of the operation surface P is so slight that the user U does not perceive the deflection.

In this case, the vibration element 11 outputs a voltage signal according to a deflection of the operation surface P, and thus the vibration detecting unit 24 detects a pressing force applied by the user U. Specifically, as illustrated in, for example, FIG. 8 by using a time interval TA, the vibration detecting unit 24 detects a voltage signal having the negative direction from a reference voltage Vref. Herein, the reference voltage Vref is a voltage that is detected by the vibration element 11 when the user U contacts with the operation surface P but does not apply thereto a depression force, in other words, the user U does not push the operation surface P.

Next, it is assumed that the user U ends the depression operation and moves his/her finger in a direction going away from the operation surface P. In this case, a force having a direction (in FIG. 7B, upward direction) in reverse to the depression direction is applied to the operation surface P, which is caused by a reaction against the deflection generated by the pressing force from the user U. Thus, as illustrated in FIG. 7B, the operation surface P deflects in a direction that is reverse to the direction when the user U performs the depression operation. In FIG. 7B, for convenience of explanation, a deflected amount of the operation surface P is illustrated with emphasis, however in actual fact, the deflection of the operation surface P is so slight that the user U does not perceive the deflection.

In this case, the vibration element 11 outputs a voltage signal according to a deflection of the operation surface P, and thus the vibration detecting unit 24 detects a force having a direction in reverse to a direction of a pressing force applied by the user U. Specifically, as illustrated in, for example, FIG. 8 by using a time interval TB, the vibration detecting unit 24 detects a voltage signal having the positive direction from the reference voltage Vref.

The vibration detecting unit 24 outputs the detected voltage signal to the operation detecting unit 25.

The operation detecting unit 25 detects a change in a pressing force against the operation surface P in accordance with a voltage signal detected by the vibration detecting unit 24 so as to detect a depression operation and an end of the depression operation. The operation detecting unit 25 informs the control unit 26 of the detected depression operation and the detected end of the depression operation.

Figure 9:
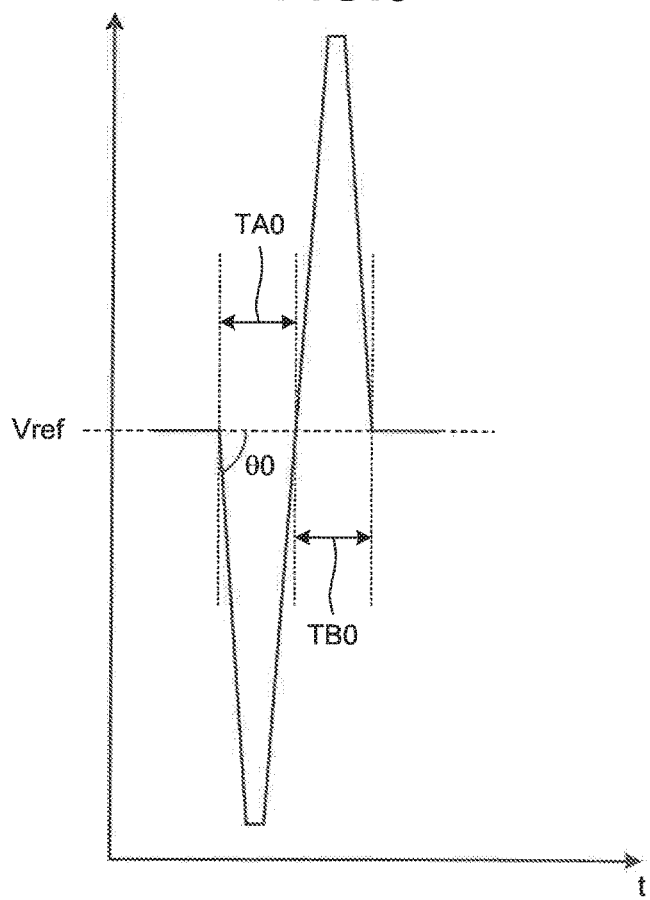

A case will be explained with reference to FIGS. 8 and 9, in which the operation detecting unit 25 detects a depression operation. First, with reference to FIG. 9, a voltage signal will be explained which is detected by the vibration detecting unit 24 when a vibration caused by other than a depression operation is generated in the operation surface P, for example. FIG. 9 is a diagram illustrating one example of a voltage signal detected by the vibration detecting unit 24.

For example, similarly to a case where the user U depresses the operation surface P by using his/her finger, when a substance hits the operation surface P, a vibration is generated in the operation surface P. In this case, as illustrated in FIG. 9, similarly to the case of the depression by the user U, the vibration detecting unit 24 detects a voltage signal having the negative direction from the reference voltage Vref during a time interval TA0, and then detects a voltage signal having the positive direction from the reference voltage Vref during the time interval TB0.

However, when a vibration caused by other than a depression operation, which is a hit of a substance and the like, is generated in the operation surface P, a period (time interval "TA0+TB0") of the vibration is shorter than that (time interval "TA+TB," see FIG. 8) in a case of a vibration caused by a depression operation. Furthermore, a peak value of the vibration is large, and thus a falling slope angle θ0 of a voltage signal is larger than a slope angle θ (see FIG. 8) in a case of the depression operation.

Therefore, for example, as illustrated in FIG. 8, the operation detecting unit 25 detects, when a time interval T1, during which a voltage signal is less than a threshold Vth, exceeds a predetermined time period Tth1, a depression operation performed by the user U. Thus, the operation detecting unit 25 hardly erroneously detects, as a depression operation, a vibration caused by other than the depression operation, which is a hit of a substance and the like, and thus an erroneous detection of a depression operation can be suppressed. The operation detecting unit 25 compares a voltage signal with the threshold Vth to be able to detect a depression operation when the user U depresses the operation surface P at a constant pressing force, and thus the detection accuracy of a depression operation can be improved.

Herein, the operation detecting unit 25 detects a depression operation in accordance with the time interval T1 during which a voltage signal is less than the threshold Vth, however, not limited thereto. For example, a time interval T2 until when a voltage signal falls below the threshold Vth may be measured, and the operation detecting unit 25 may detect a depression operation in accordance with whether or not this time interval T2 exceeds a predetermined time period Tth2.

Thus, the operation detecting unit 25 can detect a depression operation in accordance with the failing slope angle θ or θ0 of the voltage signal. Thus, for example, a depression operation is not detected when a hit of a substance and the like causes a slope of a voltage signal to be larger than a predetermined value, and thus an erroneous detection of a depression operation can be suppressed.

Next, a case will be explained, in which the operation detecting unit 25 detects an end of a depression operation. As described above, when the user U ends a depression operation and releases his/her finger from the operation surface P, a force having a direction in reverse to the depressing direction is generated. The operation detecting unit 25 detects the depression operation, and then detects, when detecting the force having this reverse direction, an end of the depression operation. Specifically, for example, when a time interval T3, during which a voltage signal is larger than the reference voltage Vref, exceeds a predetermined time period Tth3, the operation detecting unit 25 detects an end of the depression operation.

Thus, the operation detecting unit 25 can detect an end of the depression operation. Herein, for example, the vibration controlling unit 23 causes, on the basis of an instruction from the control unit 26, the vibration elements 11 to vibrate in the second vibration mode in each of the case where a depression operation is detected and the case where an end of the depression operation is detected. Thus, a vibration can be given to the user U at two times when the user U pushes his/her finger against the operation surface P and the user U releases his/her finger from the operation surface P, and thus a tactile sense can be given to the user U, which is closer to, for example, a click feeling obtained when an actual switch is clicked. Details of operations for causing the vibration elements 11 to vibrate at two times of a depression operation and an end of the depression operation will be mentioned later with reference to FIG. 10.

Herein, the operation detecting unit 25 detects an end of a depression operation in accordance with whether or not the time interval T3, during which a voltage signal exceeds the reference voltage Vref, exceeds the predetermined time period Tth3, however, not limited thereto. It is sufficient that the operation detecting unit 25 can detect an end of a depression operation when a force having a direction in reverse to that of a pressing force caused by the depression operation is detected. Thus, for example, an end of a depression operation may be detected when a voltage signal exceeds a threshold Vth2 (not illustrated) that is larger than the reference voltage Vref.

The control unit 26 switches between the operation modes of the vibration element 11 in accordance with a determination result of the determination unit 22 and a detection result of the operation detecting unit 25, and further outputs, to the on-vehicle apparatus 30, the determination result of the determination unit 22, the detection result of the operation detecting unit 25, etc. Thus, the control unit 26 controls a whole of the controller 20, and operates as a switching unit that switches between the operation modes.

When the determination unit 22 determines that the contact position C is moving, the control unit 26 sets the first vibration mode so that the vibration elements 11 vibrate at the frequency f1 in an ultrasonic frequency band. When a predetermined time period T0 has elapsed from the time at which the determination unit 22 determines that the contact position C is at a stop, the control unit 26 sets the vibration detecting mode so that the vibration elements 11 detect a vibration of the operation surface P. When the operation detecting unit 25 detects a depression operation or an end of the depression operation in the vibration detecting mode, the control unit 26 sets the second vibration mode so that the vibration elements 11 vibrate at the frequency f2 (f1>f2).

Herein, one example of an operation mode to be set by the control unit 26 will be specifically explained with reference to FIG. 10. FIG. 10 is a diagram explaining one example of an operation mode to be set by the control unit 26 according to the present embodiment. The graph illustrated in FIG. 10 is a graph that indicates a voltage signal detected by the vibration detecting unit 24.

Figure 10:
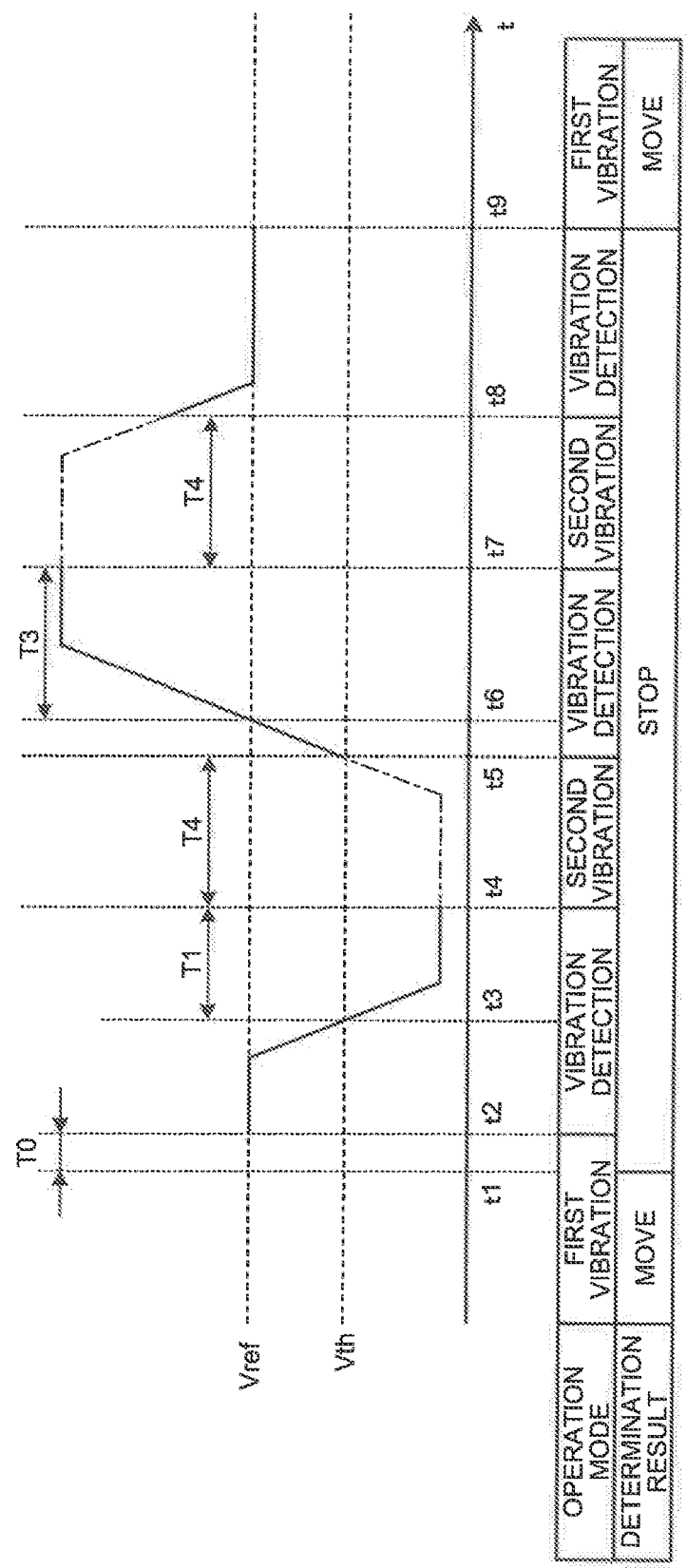
FIG. 10 is a diagram explaining one example of an operation mode to be set by a control unit according to the embodiment.

As illustrated in FIG. 10, when a determination result of the determination unit 22 is "move", the control unit 26 sets the first vibration mode as an operation mode of the vibration element 11. Next, when the determination unit 22 detects "stop" of the contact position C at a time point t1, the control unit 26 sets the operation mode of the vibration element 11 to be the vibration detecting mode at a time point t2 when the predetermined time period T0 has elapsed from the time point t1.

Herein, a reason why the control unit 26 sets the vibration detecting mode when the predetermined time period T0 has elapsed from the time at which the determination unit 22 determines "stop" will be explained. For example, when the user U moves his/her finger slowly, the position detecting unit 21 detects, in some cases, the same contact position C at present and last times. In this case, the determination unit 22 determines "stop" in spite of a movement of the finger of the user U.

Therefore, the control unit 26 continues first vibration mode until when the predetermined time period T0 has elapsed from the time of the determination of "stop" by the determination unit 22. Thus, even when a finger of the user U is slowly moving, the movement of the contact position C can be detected with high accuracy without shifting to the vibration detecting mode.

As described above, the control unit 26 sets the vibration detecting mode at the time point t2. It is assumed that the user U subsequently depresses the operation surface P and a voltage signal detected by the vibration detecting unit 24 falls to equal to or less than the reference voltage Vref. In this case, the operation detecting unit 25 measures, from a time point t3 at which the voltage signal becomes equal to or less than the threshold Vth, the time interval T1 during which the voltage signal is equal to or less than the threshold Vth, and determines whether or not the measured time interval T1 exceeds the predetermined time period Tth1. The operation detecting unit 25 detects a depression operation of the user U at a time point t4 when the measured time interval T1 exceeds the predetermined time period Tth1.

When the operation detecting unit 25 detects depression operation, the control unit 26 sets the operation mode of the vibration element 11 to be the second vibration mode during a predetermined time interval T4. Thus, the vibration controlling unit 23 controls the vibration elements 11 so that the vibration elements 11 vibrate at the frequency f2 to give a vibration to the user U. The dot-and-dash lines illustrated in FIG. 10 indicate voltage signals that are estimated to be detected by the vibration detecting unit 24 when the vibration detection of the operation surface P is continued without giving the vibration to the user U. In actual fact, the vibration elements 11 are caused to vibrate by a control of the vibration controlling unit 23 and any of voltage signals does not perform detection of a voltage signal, and thus the vibration detecting unit 24 detects no voltage signal at the time interval T4.

The control unit 26 switches between the operation mode of the vibration element 11 into the vibration detecting mode at a time point t5 when the predetermined time interval T4 has elapsed from the time point t4. Thus, the operation detecting unit 25 detects an end of the depression operation.

The operation detecting unit 25 measures the time interval T3 during which, for example, the voltage signal is continuously larger than the reference voltage Vref. In the example illustrated in FIG. 10, the operation detecting unit 25 starts to measure the time interval T3 from a time point t6. The operation detecting unit 25 detects an end of the depression operation at a time point t7 when the measured time interval T3 exceeds the predetermined time period Tth3.

When the operation detecting unit 25 detects the end of the depression operation, the control unit 26 sets the operation mode of the vibration elements 11 to be the second vibration mode during the predetermined time interval T4. Thus, the vibration controlling unit 23 controls the vibration elements 11 so that the vibration elements 11 vibrate at the frequency f2 and give a vibration to the user U. Thus, the vibration elements 11 are caused to vibrate in the second vibration mode at two times of a detection time of a depression operation and a detection time of an end of the depression operation, and thus a click feeling such as clicking a switch can be given to the user U.

The control unit 26 changes the operation mode of the vibration element 11 into the vibration detecting mode at a time point t8 when the predetermined time interval T4 has elapsed from the time point t7. Thus, the operation detecting unit 25 restarts to detect a depression operation.

Herein, it is assumed that the determination unit 22 determines, at a time point t9, that there exists a "move" of the contact position C in such a state that the operation detecting unit 25 detects no depression operation. In this case, the control unit 26 ends the vibration detecting mode, and sets the first vibration mode.

Thus, the control unit 26 switches between the operation modes of the vibration element 11 in accordance with a determination result of the determination unit 22 and a detection result of the operation detecting unit 25. Thus, two functions of a vibration function for causing vibration elements 11 to vibrate the operation surface P and a detection function for detecting a vibration of the operation surface P can be combined. Thus, enlargement of the input device 10 having vibration and detection functions can be suppressed.

In a case where the user U performs a depression operation for depressing the operation surface P without moving his/her finger, even when the position detecting unit 21 detects the contact position C, the determination unit 22 determines that the contact position C is at a stop and is not moving. In this case, the control unit 26 executes the process after the time point t1. Thus, even when the user U depresses the operation surface P without moving his/her finger, the operation detecting unit 25 can detect the depression process.

Returning to FIG. 3 the on-vehicle apparatus 30 will be explained. The on-vehicle apparatus 30 includes an on-vehicle-apparatus-side controller 31 in addition to the aforementioned speaker 34 and display 35. The on-vehicle-apparatus-side controller 31 is a controller that controls a whole of the on-vehicle apparatus 30, and includes, for example, a display controlling unit 33 and a sound controlling unit 32.

The display controlling unit 33 causes the display 35 to display an image in response to an input operation performed the user U which input from the input system 1, such as the contact position C and a depression operation.

The sound controlling unit 32 controls the speaker 34 in response to, for example, an input operation performed by the user U which is input from the input system 1, so as to cause the speaker 34 to output sounds.

The illustration thereof is omitted, the on-vehicle-apparatus-side controller 31 controls various devices (audio device, air conditioner, car navigation system, etc.) of the on-vehicle apparatus 30 in response to, for example, an input operation performed by the user U, which is input from the input system 1.

In the example illustrated in FIG. 3, the input system 1 and the on-vehicle apparatus 30 are separately configured from each other, however, not limited thereto. For example, the input system 1, and the display 35 and the display controlling unit 33 of the on-vehicle apparatus 30 may be configured as a display apparatus 100. In this case, the display apparatus 100 may include a touch panel in which, for example, the display 35 and the input device 10 are integrally formed. This display apparatus 100 is suitable for an information terminal such as a display device mounted on a vehicle and the like, a smartphone, and a tablet. This display apparatus 100 can give, to the user U, an operatig feeling using a tactile sense in addition to a sense of sight.

Figure 11:
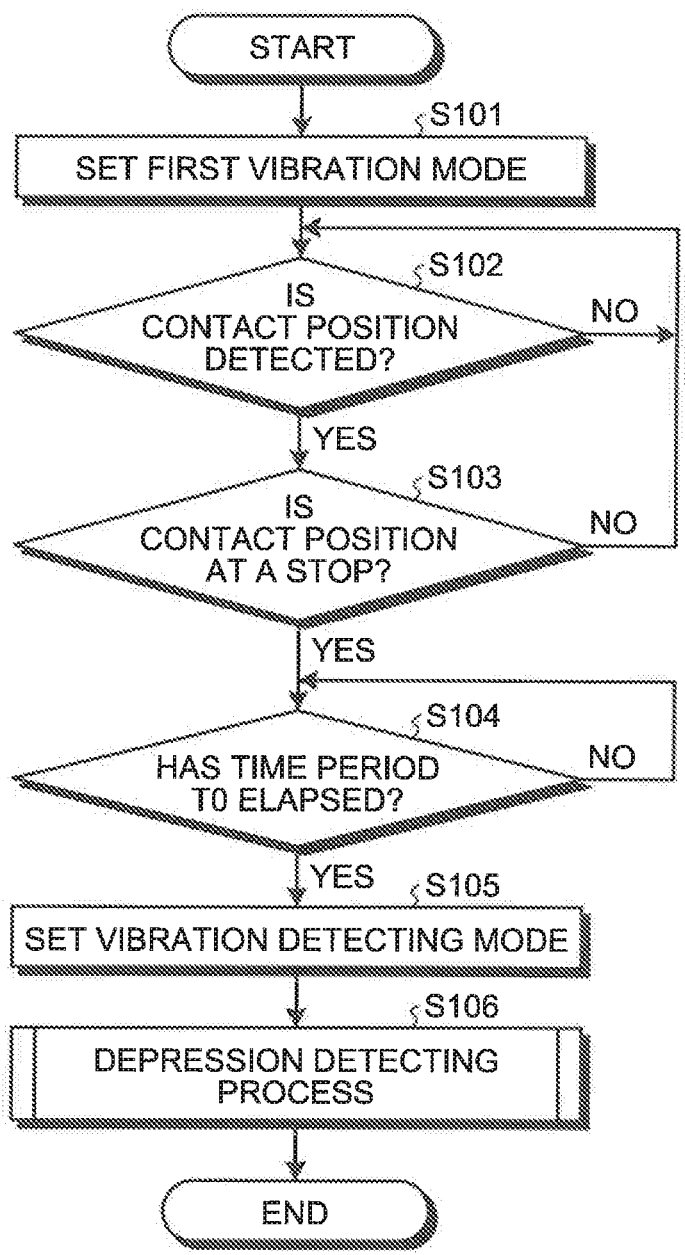
FIG. 11 is a flowchart illustrating a detection process according to the embodiment.
Figure 12:
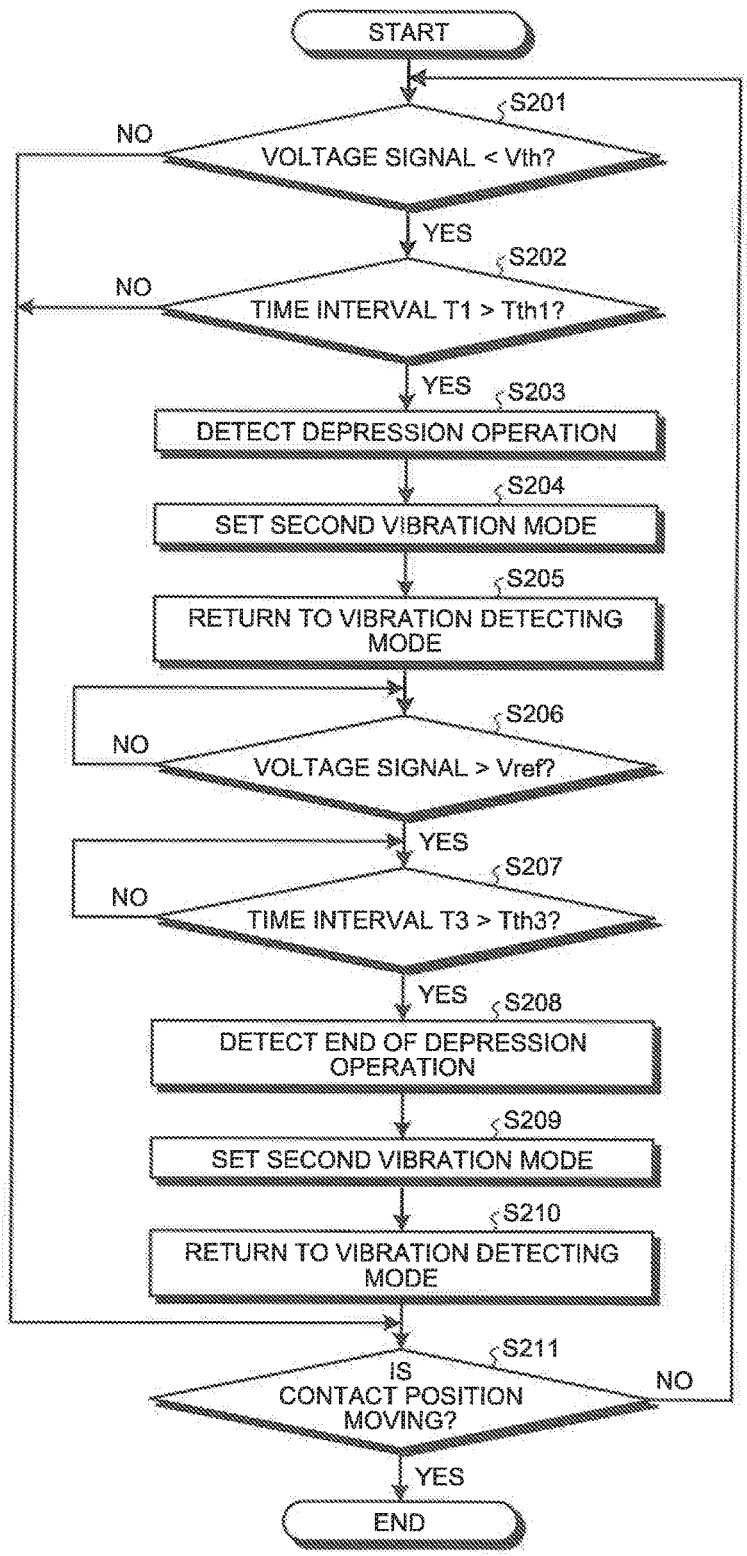
FIG. 12 is a flowchart illustrating a depression detecting process according to the embodiment.

Processes to be executed by the controller 20 will be explained with reference to FIGS. 11 and 12. FIG. 11 is a flowchart illustrating a detection process according to the present embodiment. FIG. 12 is a flowchart illustrating a depression detecting process according to the present embodiment. The controller 20 repeatedly executes the detection process illustrated in FIG. 11 while the input device 10 is accepting an input operation performed by the user U.

First, the controller 20 sets the first vibration mode as an operation mode of the vibration element 11 (Step S101). The controller 20 determines whether or not the contact position C of the user U is detected (Step S102). When the contact position C is not detected (Step S102: No), the process is returned to Step S102.

When detecting the contact position C (Step S102: Yes), the controller 20 determines whether or not the detected contact position C is at a stop (Step S103). When the contact position C detected at a present time is different from the contact position C detected at a last time, the controller 20 determines that the contact position C is moving (Step S103: No), and returns to Step S102.

On the other hand, when the contact position C detected at a present time is the same as the contact position C detected at a last time, the controller 20 determines that the contact position C is at a stop (Step S103: Yes), and further determines whether or not the predetermined time period T0 has elapsed (Step S104). When the predetermined time period T0 has not elapsed (Step S104: No), the controller 20 returns to Step S104, and waits for the predetermined time period T0 to have elapsed.

When the predetermined time period T0 has elapsed (Step S104: Yes), the controller 20 sets the vibration detecting mode as an operation mode of the vibration elements 11 (Step S105), and further executes a depression detecting process (Step S106).

Next, the depression detecting process to be executed by the controller 20 will be explained with reference to FIG. 12. When setting an operation mode of the vibration elements 11 to be the vibration detecting mode, the controller 20 executes the depression detecting process illustrated in FIG. 12.

The controller 20 determines whether or not a voltage signal detected by the vibration detecting unit 24 is less than the threshold Vth (Step S201). When the voltage signal is equal to or more than the threshold Vth (Step S201: No), the process is advanced to Step S211.

When the voltage signal is less than the threshold Vth (Step S201: Yes), the controller 20 measures the time interval T1 during which the voltage signal is less than the threshold Vth, and further determines whether or not the time interval T1 exceeds the predetermined time period Tth1 (Step S202). When the time interval T1 is equal to or less than the time period Tth1 (Step S202: No), the process is advanced to Step S211.

When the time interval T1 exceeds the time period Tth1 (Step S202: Yes), the controller 20 detects a depression operation (Step S203), and sets the second vibration mode so as to cause the operation surface P to be vibrated during the time interval. T4 (Step S204).

After the time interval T4 has elapsed, the controller 20 returns the operation mode of the vibration elements 11 to the vibration detecting mode (Step S205). Next, the controller 20 determines whether or not the voltage signal exceeds the reference voltage Vref (Step S206). When the voltage signal is equal to or less than the reference voltage Vref (Step S206: No), the controller 20 returns the process to Step S206 and waits for the voltage signal to exceed the reference voltage Vref.

On the other hand, when the voltage signal exceeds the reference voltage Vref (Step S206: Yes), the controller 20 measures the time interval T3 during which the voltage signal exceeds the reference voltage Vref, and further determines whether or not this time interval T3 exceeds the predetermined time period Tth3 (Step S207). When the time interval T3 does not exceed the time period Tth3 (Step S207: No), the controller 20 returns the process to Step S207 so as to wait for the time interval T3 to exceed the time period Tth3.

When the time interval T3 exceeds the time period Tth3 (Step S207: Yes), the controller 20 detects an end of the depression operation (Step S208), and sets the second vibration mode so as to cause the operation surface P to be vibrated during the time interval T4 (Step S209).

After the time interval T4 has elapsed, the controller 20 returns the operation mode of the vibration elements 11 to the vibration detecting mode (Step S210). Next, the controller 20 determines whether or not the contact position C is moving (Step S211). When the contact position C is not moving (Step S211: No), the controller 20 returns the process to Step S201, and is to detect a depression operation. On the other hand, when the contact position C is moving (Step S211: Yes), the process is terminated.

As described above, the controller 20 according to the present embodiment switches, in accordance with a change in the contact position C of the user U, an operation mode of the vibration elements 11 between the first vibration mode and the vibration detecting mode. Thus, the controller 20 can perform, by using the vibration elements 11, a vibration control of the operation surface P and a vibration detection of the operation surface P, and thus enlargement of the input device 10 can be suppressed.

In the aforementioned embodiment, the vibration controlling unit 23 causes, in the first vibration mode, the vibration elements 11 to vibrate at the frequency f1, however, not limited thereto. In the first vibration mode, it is sufficient that the input system 1 gives a predetermined tactile sense to the user U. For example, when the vibration controlling unit 23 causes the vibration elements 11 to alternately vibrate at the frequency f1 and a frequency f3 that is different from the frequency f1, a tactile sense of a click feeling can be given to the user U. The vibration controlling unit 23 may cause the vibration elements 11 not to vibrate in the first vibration mode. In this case, because the frictional force between a finger of the user U and the operation surface P increases, for example, a tactile sense of a rough feeling can be given to the user U.

In the aforementioned embodiment, when the user U depresses the operation surface P, the vibration detecting unit 24 detects the voltage signal having the negative direction from the reference voltage Vref, however, not limited thereto. For example, there may be a case where the vibration detecting unit 24 detects a voltage signal having the positive direction from the reference voltage Vref when the user U depresses the operation surface P, and the vibration detecting unit 24 detects a voltage signal having the negative direction from the reference voltage Vref when the user U releases his/her finger from the operation surface P. This depends on a voltage signal to be generated by the vibration element 11. For example, in a case where the user U depresses the operation surface F, when the vibration detecting unit 24 detects a voltage signal having the positive direction from the reference voltage Vref, the operation detecting unit 25 detects the depression operation in accordance with, for example, whether or not the voltage signal exceeds the threshold Vth.

As described above, the controller 20 according to the embodiment includes the switching unit (control unit) 26, the vibration controlling unit 23, the vibration detecting unit 24. The switching unit (control unit) 26 switches between vibration and detection modes (first vibration and vibration detecting modes) of the at least one vibration element 11 of the vibration elements 11 in accordance with a temporal change in the contact position C with the operation surface P. The vibration mode is a mode in which the at least one vibration element 11 is caused to vibrate, and the detection mode is a mode in which the at least one vibration element 11 detects a vibration. The vibration controlling unit 23 causes, in the vibration mode (first vibration mode), one or more first vibration elements of the vibration elements 11 to vibrate so as to vibrate the operation surface P. The one or more first vibration elements includes the at least one vibration element 11. The vibration detecting unit 24 detects, in the detection mode (vibration detecting mode), a vibration of the operation surface P on the basis of detection results of the vibration detected by one or more second vibration elements of the vibration elements 11. The one or more second vibration elements includes the at least one vibration element 11.

Thus, the controller 20 can switch between vibration and detection modes to operate the at least one vibration element 11, so that it is possible to reduce the number of the vibration elements 11. Thus, enlargement of the input device 10 can be suppressed.

The one or more first vibration elements (namely, one or more vibration elements vibrated by the vibration controlling unit 23) and the one or more second vibration elements (namely, one or more vibration elements by which the vibration detecting unit 24 detects a vibration) are the same.

Thus, any vibration element for detecting a vibration of the operation surface P is not to be provided in addition to the one or more first vibration elements for vibrating the operation surface P, and thus enlargement of the input device can be suppressed.

The first vibration elements include third two vibration elements (two of vibration elements 11a to 11d) and fourth two vibration elements (the other two of vibration elements 11a to 11d). The operation surface P has a rectangular shape. The vibration controlling unit 23 causes the third and fourth two vibration elements to vibrate. Each of the third and fourth two vibration elements are arranged in a neighborhood of a corresponding one of two short sides of the rectangular-shaped operation surface P. Thus, the vibration elements 11a to 11d can efficiently vibrate the operation surface P.

The vibration detecting unit 24 detects the vibration of the operation surface P on the basis of the vibration detected by at least one of the vibration elements 11a to 11d arranged in the neighborhoods of the two short sides. Thus, the vibration detecting unit 24 can detect the vibration of the operation surface P more reliably.

The switching (control unit) 26 switches between the vibration and detection modes so that (i) the one or more first vibration elements (vibration elements 11) vibrate when the contact position C is moving; and (ii) the one or more second vibration elements (vibration elements 11) detect a vibration when the contact position C is at a stop.

Thus, the controller 20 can detect a vibration of the operation surface P when the contact position C is at a stop.

The controller 20 further includes the operation detecting unit 25 that detects a depression operation when a pressing force against the operation surface P is detected, the basis of a detection result of the vibration detecting unit 24.

Thus, the controller 20 can detect a depression operation performed by the user U.

The vibration controlling unit 23 causes the one or more first vibration elements (vibration elements 11) to vibrate when the operation detecting unit 25 detects the depression operation.

Thus, the vibration controlling unit 23 can inform the user U of an acceptance of a depression operation, so that it is possible to improve the operability of the user U.

The vibration controlling unit 23 sets the frequency f2, at which the one or more first vibration elements (vibration elements 11) are vibrated when the depression operation is detected, to be lower than the frequency f1 at which the one or more first vibration elements (vibration elements 11) are vibrated when the contact position C is moving.

Thus, when the contact position C is moving, the vibration controlling unit 23 not only can give a smooth tactile sense to the user U but also can inform the user U of an acceptance of a depression operation when the depression operation is detected. Thus, the vibration controlling unit 23 can give, to the user U, tactile senses that are different for each operation, so that it is possible to improve the operability of the user U.

When a force having a direction in reverse to a direction of the pressing force is detected on the basis of the detection result of the vibration detecting unit 24, the operation detecting unit 25 detects an end of the depression operation.

Thus, the operation detecting unit 25 can detect an end of a depression operation performed by the user U.

The vibration controlling unit 23 causes the one or more first vibration elements (vibration elements 11) to vibrate when the operation detecting unit 25 detects the end of the depression operation.

Thus, the vibration controlling unit 23 can give, to the user U, such a click feeling that the user U depresses a switch, so that it is possible to improve the operability of the user U.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A controller comprising:
a processor programmed to:
detect a contact position with an operation surface;
switch between vibration and detection modes of at least one vibration element including a piezoelectric element, in accordance with a temporal change along the operation surface of the detected contact position, the vibration mode being a mode in which the at least one vibration element is caused to vibrate, and the detection mode being a mode in which the at least one vibration element detects a vibration;

cause, in the vibration mode, one or more first vibration elements to vibrate so as to vibrate the operation surface, the at least one vibration element including the one or more first vibration elements; and detect, in the detection mode, a vibration of the operation surface based on detection results of the vibration detected by one or more second vibration elements, the at least one vibration element including the one or more second vibration elements.

2. The controller according to claim 1, wherein the one or more first vibration elements and the one or more second elements are identical.

3. The controller according to claim 1, wherein the one or more first and second vibration elements include four vibration elements, the operation surface has a rectangular shape, and the processor is further programmed to:

cause the four vibration elements to vibrate, two of the four vibration elements being arranged in a neighborhood of one of two short sides of the rectangular-shaped operation surface, and remaining two of the four vibration elements being arranged in a neighborhood of other of two short sides of the rectangular-shaped operation surface.

4. The controller according to claim 3, wherein the processor is further programmed to:

detect the vibration of the operation surface based on the vibration detected by at least one of the four vibration elements arranged in the neighborhoods of the two short sides.

5. The controller according to claim 1, wherein the processor is further programmed to:

switch between the vibration and detection modes so that (i) the one or more first vibration elements vibrate when the contact position is moving; and (ii) the one or more second vibration elements detect a vibration when the contact position is at a stop.

6. The controller according to claim 1, wherein the processor is further programmed to:

detect a depression operation when a pressing force against the operation surface is detected, based on a detection result of a vibration of the operation surface.

7. The controller according to claim 6, wherein the processor is further programmed to:

cause the one or more first vibration elements to vibrate when detecting the depression operation.

8. The controller according to claim 6, wherein the processor is further programmed to:

set a frequency, at which the one or more first vibration elements are vibrated when the depression operation is detected, to be lower than a frequency at which the one or more first vibration elements are vibrated when the contact position is moving.

9. The controller according to claim 6, wherein the processor is further programmed to:

when a force having a direction in reverse to a direction of the pressing force is detected, the detect an end of the depression operation.

10. The controller according to claim 9, wherein the processor is further programmed to:

cause the one or more first vibration elements to vibrate when detecting the end of the depression operation.

11. An input device comprising:

an operation unit that includes an operation surface to detect a contact position with the operation surface; and at least one vibration element including a piezoelectric element, the at least one vibration element being controlled so that vibration and detection modes are switched in accordance with a temporal change along the operation surface of the contact position detected by the operation unit, the vibration mode being a mode in which the operation surface is vibrated, and the detection mode being a mode in which a vibration of the operation surface is detected.

12. An input system comprising:

an operation surface;

at least one vibration element of a plurality of vibration elements, which vibrates the operation surface or detects a vibration of the operation surface, each of the plurality of vibration elements having a piezoelectric element; and a processor programmed to:

switch between vibration and detection modes in accordance with a temporal change along the operation surface of the detected contact position, the vibration mode being a mode in which the one or more first vibration elements of the vibration elements are caused to vibrate, the detection mode being a mode in which a vibration is detected by one or more second vibration elements of the vibration elements, the first vibration elements including the at least one vibration element, and the second vibration elements including the at least one vibration element;

cause, in the vibration mode, the one or more first vibration elements to vibrate so as to vibrate the operation surface; and detect, in the detection mode, a vibration of the operation surface based on the vibration detected by the one or more second vibration elements.

13. A display apparatus comprising:

the input device according to claim 11; and a display that displays an image in accordance with the contact position.

14. A control method comprising:

detecting a contact position with an operation surface;

switching between vibration and detection modes of at least one vibration element of a plurality of vibration elements, each of the plurality of vibration elements having a piezoelectric element, in accordance with a temporal change along an operation surface of the detected contact position, the vibration mode being a mode in which the one or more vibration elements are caused to vibrate, and the detection mode being a mode in which a vibration is detected;

causing, in the vibration mode, one or more first vibration elements of the vibration elements to vibrate so as to vibrate the operation surface, the one or more first vibration elements including the at least one vibration element; and detecting, in the detection mode, a vibration of the operation surface based on detection results of the vibration detected by one or more second vibration elements of the vibration elements, the one or more second vibration elements including the at least one vibration element.

* * * * *